United States Patent
Teboulle

(10) Patent No.: US 11,199,429 B2
(45) Date of Patent: Dec. 14, 2021

(54) METHOD FOR MEASURING A SPEED OF A FLUID

(71) Applicant: SAGEMCOM ENERGY & TELECOM SAS, Rueil Malmaison (FR)

(72) Inventor: Henri Teboulle, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 90 days.

(21) Appl. No.: 16/627,072

(22) PCT Filed: Jun. 22, 2018

(86) PCT No.: PCT/EP2018/066810
§ 371 (c)(1),
(2) Date: Dec. 27, 2019

(87) PCT Pub. No.: WO2019/002145
PCT Pub. Date: Jan. 3, 2019

(65) Prior Publication Data
US 2020/0141777 A1    May 7, 2020

(30) Foreign Application Priority Data

Jun. 27, 2017   (FR) ..................................... 17 55910

(51) Int. Cl.
*G01F 1/66* (2006.01)
*G01F 25/00* (2006.01)
(Continued)

(52) U.S. Cl.
CPC .......... *G01F 1/668* (2013.01); *G01F 25/0007* (2013.01); *G01P 5/245* (2013.01);
(Continued)

(58) Field of Classification Search
CPC ...... G01F 1/668; G01F 25/0007; G06F 17/15; G06F 17/17; G01P 5/245
See application file for complete search history.

(56) References Cited

U.S. PATENT DOCUMENTS 4,456,376 A * 6/1984 Carrington ............. G01C 19/72
                                                          356/464
4,782,697 A * 11/1988 Williams ................ G01F 1/662
                                                          73/170.13
(Continued)

FOREIGN PATENT DOCUMENTS

EP          0797105 A2    9/1997
WO     WO2016150385 A1    9/2016

*Primary Examiner* — Arleen M Vazquez
*Assistant Examiner* — Brandon J Becker
(74) *Attorney, Agent, or Firm* — Muncy, Geissler, Olds & Lowe, P.C.

(57) ABSTRACT

A method for measuring a speed of a fluid includes transmitting an ultrasonic measurement signal; acquiring and digitizing a measurement portion of an ultrasonic measurement signal received after traveling a defined length to obtain measurement samples; estimate, from the samples, an amplitude of the measurement portion; access reference samples forming a reference curve which is an interpolation of the measurement samples; produce adjusted measurement samples by multiplying the samples by ratio between an amplitude of the reference curve and the amplitude of the measurement portion; determine a unit time delay between the adjusted measurement sample and the reference curve; estimate a zero-crossing time of the measurement portion from the unit time delay and from the reference samples, estimate, from an average of the zero-crossing times, the time it takes the ultrasonic measurement signal to travel the defined length; estimate the speed of the fluid from the travel time measurement.

15 Claims, 6 Drawing Sheets

(51) Int. Cl.
 *G01P 5/24* (2006.01)
 *G06F 17/15* (2006.01)
 *G06F 17/17* (2006.01)
 *H03M 1/12* (2006.01)

(52) U.S. Cl.
 CPC .............. *G06F 17/15* (2013.01); *G06F 17/17* (2013.01); *H03M 1/12* (2013.01); *H03M 1/124* (2013.01); *H03M 1/1205* (2013.01)

(56) References Cited

U.S. PATENT DOCUMENTS

| | | | | |
|---|---|---|---|---|
| 5,748,504 A | * | 5/1998 | Fletcher-Haynes | G01F 1/662 702/100 |
| 6,202,494 B1 | * | 3/2001 | Riebel | G01F 1/662 73/861.29 |
| 6,595,070 B1 | * | 7/2003 | Cole | G01P 5/245 73/861.27 |
| 2003/0174083 A1 | * | 9/2003 | Mayfield | H03M 1/1019 341/166 |
| 2005/0055171 A1 | * | 3/2005 | Freund, Jr. | G01F 1/72 702/89 |
| 2009/0222231 A1 | * | 9/2009 | Berger | F02D 41/187 702/104 |
| 2010/0275703 A1 | * | 11/2010 | McAnally | G01F 25/0007 73/861.357 |
| 2012/0271568 A1 | * | 10/2012 | Wilson | G01F 1/668 702/48 |
| 2014/0012518 A1 | * | 1/2014 | Ramamurthy | G01F 1/668 702/48 |
| 2014/0260589 A1 | * | 9/2014 | Hallundbæk | E21B 47/107 73/152.32 |
| 2014/0360264 A1 | * | 12/2014 | Vogel | G01F 23/284 73/290 V |
| 2015/0317281 A1 | * | 11/2015 | Sharifi | G06F 17/15 708/422 |
| 2016/0334255 A1 | * | 11/2016 | Gestner | G01F 1/66 |
| 2018/0113160 A1 | * | 4/2018 | Warburton | G06F 17/17 |

* cited by examiner

METHOD FOR MEASURING A SPEED OF A FLUID

The invention relates to the field of methods for measuring a speed of a fluid.

BACKGROUND OF THE INVENTION

An ultrasound-based fluid meter conventionally uses, to measure a flowrate of a fluid flowing in a pipe, a device for measuring the speed of the fluid by emission and reception of measurement ultrasound signals.

The measurement device comprises a duct, connected to the pipe, in which the fluid flows. To measure the speed of the fluid, a measurement ultrasound signal traversing a path of defined length is emitted in the duct, the path times taken by the measurement ultrasound signal to traverse the path of defined length from upstream to downstream and from downstream to upstream are measured, and the speed of the fluid is estimated on the basis notably of the defined length and of the difference between the path times.

Such a measurement device 1, sometimes referred to as a classical pipe, is visible in FIG. 1. The measurement device 1 comprises a first transducer 2a, a second transducer 2b, and a measurement module 3 which is linked to the first transducer 2a and to the second transducer 2b.

The first transducer 2a and the second transducer 2b are paired in frequency and in emission level. The first transducer 2a and the second transducer 2b are for example piezoelectric transducers.

The path of defined length is therefore a rectilinear path of length L between the first transducer 2a and the second transducer 2b.

The first transducer 2a emits a measurement ultrasound signal Se. The measurement ultrasound signal Se is for example generated on the basis of a rectangular signal 4. The second transducer 2b receives a received measurement ultrasound signal Sr resulting from the propagation in the fluid of the measurement ultrasound signal Se.

The measurement module 3 measures the path time taken by the measurement ultrasound signal Se to traverse the path of defined length from upstream to downstream.

In reality, the measurement module 3 measures an overall transfer time $T_{AB}$ from the first transducer 2a to the second transducer 2b.

The overall transfer time $T_{AB}$ is such that:

$T_{AB}=TA_A+ToF_{AB}+TR_B$, where:

$TA_A$ is a switch-on time of the first transducer 2a;

$ToF_{AB}$ corresponds to the Time of Flight taken by the measurement ultrasound signal Se to traverse the path of defined length between the first transducer 2a and the second transducer 2b;

$TR_B$ is a reception time of the second transducer 2b.

Likewise, the second transducer 2b emits a measurement ultrasound signal which is received by the first transducer 2a.

The overall transfer time $T_{BA}$ is such that:

$T_{BA}=TA_B+ToF_{BA}+TR_A$, where:

$TA_B$ is a switch-on time of the second transducer 2b;

$ToF_{BA}$ corresponds to the Time of Flight taken by the measurement ultrasound signal to traverse the path of defined length between the second transducer 2b and the first transducer 2a;

$TR_A$ is a reception time of the first transducer 2a.

By assuming that:

$TA_A=TA_B$ and $TR_A=TR_B$, we obtain:

$\Delta T=T_{BA}-T_{AB}=ToF_{BA}-ToF_{AB}=DToF$, where DToF is the Differential Time of Flight.

However, the DToF is proportional to the average speed V of the fluid, and the measurement module 3 then calculates the average speed V of the fluid using the formula: $DToF=2L \cdot \nabla/(C^2-\nabla^2)$, where C is the speed of an ultrasound wave in the fluid. For example, the speed of an ultrasound wave in water is equal to about 1500 m/s, and depends on the temperature of the water.

The measurement module 3 then deduces from the, signed, average speed $\nabla$, the flowrate of the fluid flowing in the pipe.

The flowrate measurement span specified for such an ultrasound-based fluid meter is very wide, and can extend between a measurement startup flowrate of 1l/h and a maximum flowrate of 2500l/h. Such a flowrate measurement span corresponds to signed DToF values whose absolute value lies in a temporal measurement span which extends, at the water temperature of 20° C., between 315 ps and 393.5 ns. To obtain the accuracy required in the whole of the flowrate measurement span, it is appropriate to produce particularly accurate measurements of DToF over the whole of the temporal measurement span.

OBJECT OF THE INVENTION

The object of the invention is to improve the accuracy of flowrate measurements carried out by an ultrasound-based fluid meter.

SUMMARY OF THE INVENTION

With a view to achieving this aim, there is proposed a method for measuring a speed of a fluid, comprising the steps of:

emitting a measurement ultrasound signal;

acquiring and digitizing a measurement portion of a measurement ultrasound signal received after the measurement ultrasound signal has traversed a path of defined length, to obtain measurement samples;

accessing reference samples of a prefilled reference table stored in a memory, the reference samples forming a reference curve which constitutes an interpolation of the measurement samples;

producing, on the basis of the measurement samples and of the reference samples, a measurement of path time of the measurement ultrasound signal to traverse the path of defined length;

estimating the speed of the fluid on the basis of the path time measurement.

The digitization of the measurement portion of the received measurement ultrasound signal makes it possible to obtain measurement samples on which it is possible to carry out diverse processings. These processings provide a very accurate estimation of the speed of the fluid and therefore of the flowrate.

There is also proposed an ultrasound-based fluid meter comprising a first transducer, a second transducer, and a measurement module comprising a master microcontroller, a slave microcontroller and an FPGA in which is programmed a delay generation block, the ultrasound-based fluid meter being designed to implement the measurement method which has just been described.

There is also proposed a computer program comprising instructions for implementing, by a microcontroller of an ultrasound-based fluid meter, the measurement method which has just been described.

There are proposed moreover storage means which store a computer program comprising instructions for implementing, by a microcontroller of an ultrasound-based fluid meter, the measurement method which has just been described.

Other characteristics and advantages of the invention will emerge on reading the description which follows of non-limiting particular embodiments of the invention.

BRIEF DESCRIPTION OF THE DRAWINGS

Reference will be made to the appended drawings, among which.

DETAILED DESCRIPTION OF THE INVENTION

Figure 1:
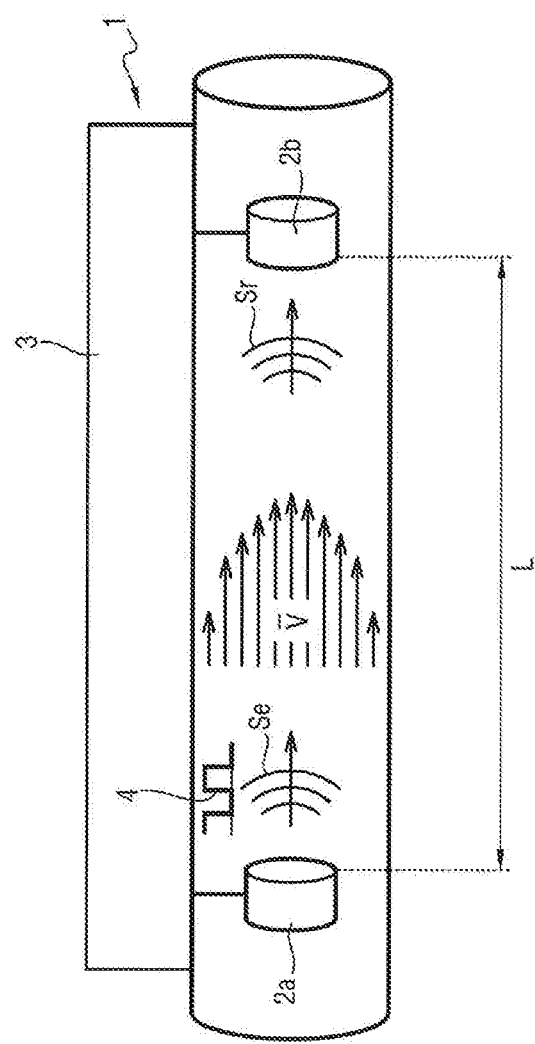
FIG. 1 represents an ultrasound-based fluid meter according to the prior art.
Figure 2:
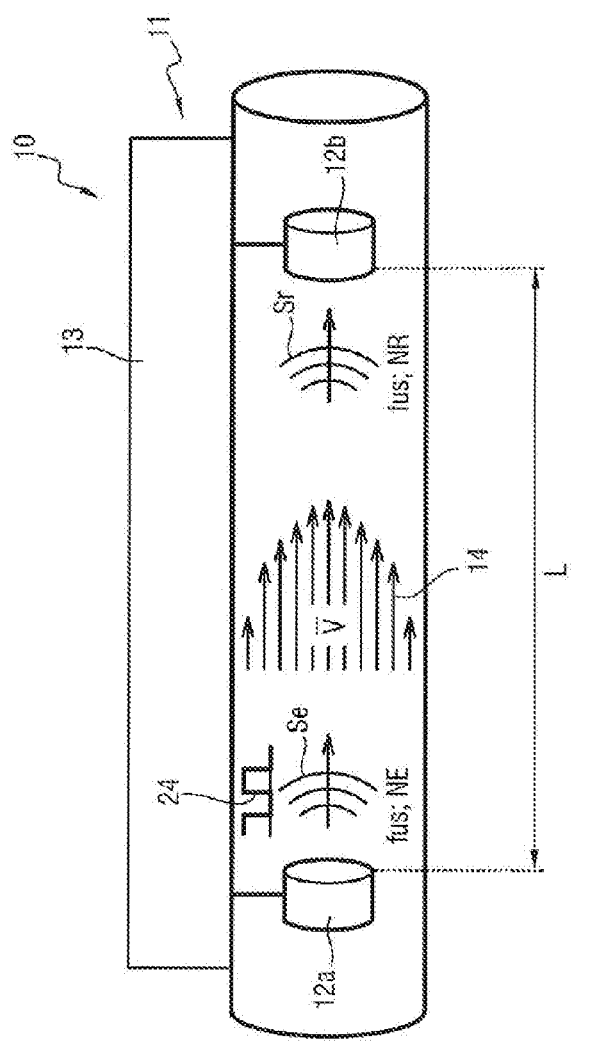
FIG. 2 represents an ultrasound-based fluid meter in which a measurement method according to a first embodiment of the invention is implemented.

With reference to FIG. 2, the method for measuring a speed of a fluid according to a first embodiment of the invention is implemented here in an ultrasound-based water meter 10.

The ultrasound-based water meter 10 comprises a duct in which there flows water provided by a distribution network to an installation, as well as a device for measuring the speed of the water 11.

The water flows in the duct from upstream to downstream, as is indicated by the sense of the arrows 14, but could equally well flow from downstream to upstream.

The measurement device 11 comprises a first transducer 12a, a second transducer 12b, and a measurement module 13 which is linked to the first transducer 12a and to the second transducer 12b.

The first transducer 12a and the second transducer 12b are paired. The first transducer 12a and the second transducer 12b are here piezoelectric transducers.

The measurement module 13 drives the first transducer 12a and the second transducer 12b.

Figure 3:
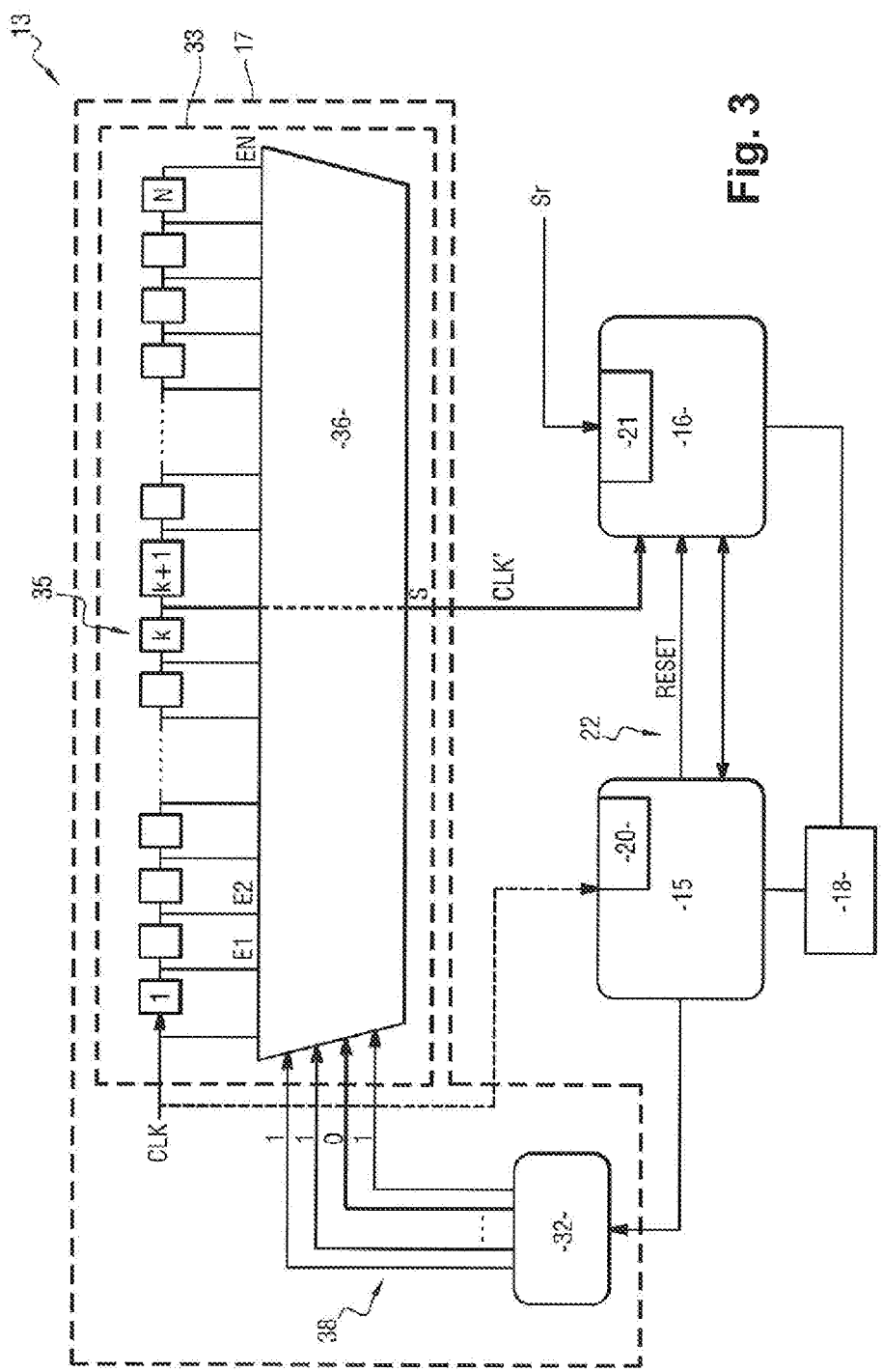
FIG. 3 represents a master microcontroller, a slave microcontroller and an FPGA of a measurement module of the ultrasound-based fluid meter.

With reference to FIG. 3, the measurement module 13 comprises a master microcontroller 15, a slave microcontroller 16, an FPGA 17 and a memory 18.

The master microcontroller 15 comprises a temperature measurement block 20, which acquires temperature measurements of the fluid carried out by a temperature sensor situated in the duct or in proximity to the duct.

The slave microcontroller 16 comprises a 12-bit analogue-digital converter 21.

The master microcontroller 15 and the slave microcontroller 16 are linked by a communication channel 22 which is here an SPI (for Serial Peripheral Interface) bus.

The master microcontroller 15 is linked to the FPGA 17.

The first transducer 12a and the second transducer 12b each fulfil successively the function of an emitter of measurement ultrasound signals Se, and the function of a receiver of received measurement ultrasound signals Sr.

The measurement module 13 thus provides electrical signals to the emitter that the latter transforms into measurement ultrasound signals Se. The electrical signals are here rectangular signals 24. The measurement module 13 acquires the received measurement ultrasound signals Sr which are received by the receiver.

The emitter emits the measurement ultrasound signals Se at an emission frequency fus. The frequency fus is conventionally between 900 kHz and 4 MHz, and is equal here to 1 MHz.

The measurement ultrasound signals Se thus traverse, between the first transducer 12a and the second transducer 12b, a path of defined length L from upstream to downstream and from downstream to upstream. The path of defined length is here a rectilinear path between the first transducer 12a and the second transducer 12b.

In FIG. 2, the first transducer 12a fulfilling the function of an emitter and the second transducer 12b fulfilling the function of a receiver have been represented. The measurement ultrasound signal Se therefore traverses the path of defined length from upstream to downstream. The measurement ultrasound signal Se is emitted by the emitter with a level NE. The measurement ultrasound signal received Sr is received by the receiver with a level NR lower than the level NE.

The measurement module 13 produces a path time measurement representative of a time taken by the measurement ultrasound signal Se to traverse the path of defined length L from upstream to downstream, and then produces a path time measurement representative of a time taken by the measurement ultrasound signal Se to traverse the path of defined length L from downstream to upstream, and then finally evaluates the speed of the water as a function of these path time measurements.

Figure 4:
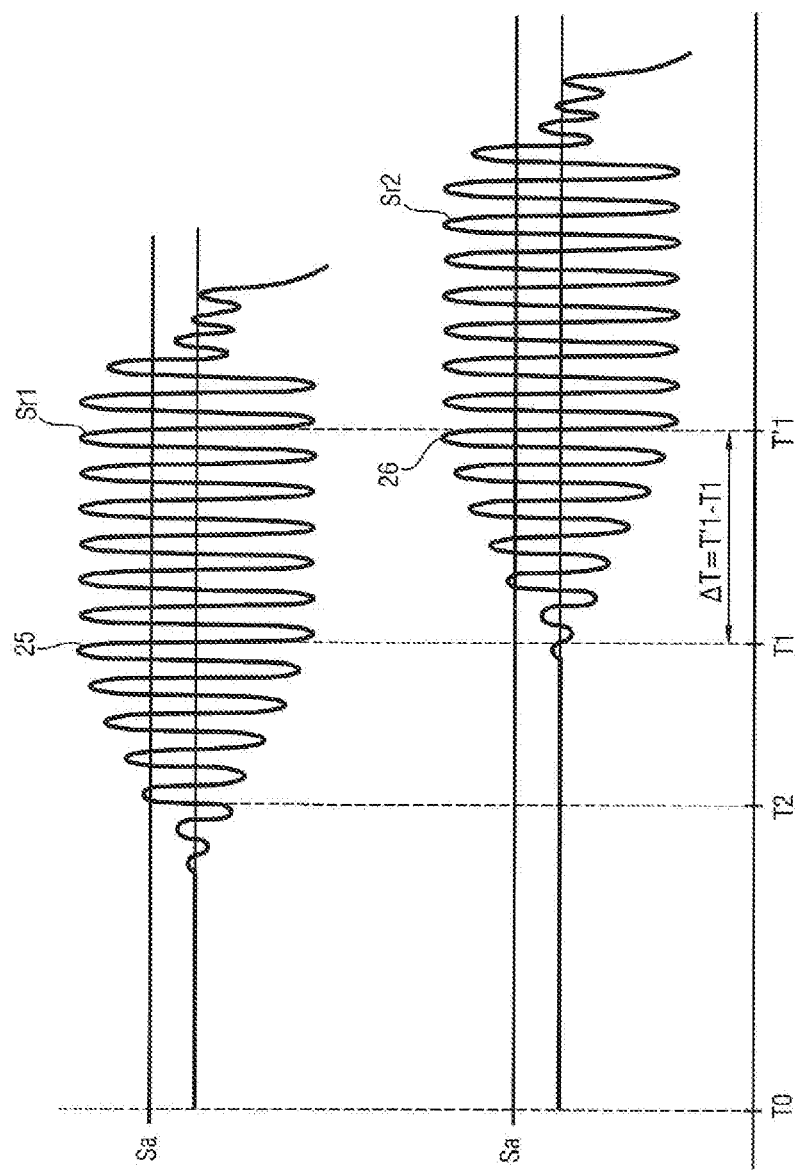
FIG. 4 represents a measurement ultrasound signal received after having traversed a path of defined length from upstream to downstream, and a measurement ultrasound signal received after having traversed a path of defined length from downstream to upstream.

FIG. 4 represents firstly a received measurement ultrasound signal Sr1 which is received by the measurement module 13 after having traversed the path of defined length L from upstream to downstream.

The receiver activates the reception at a moment T0, synchronized with the emission of the measurement ultrasound signal. The pairing of the emitter and of the receiver enables this synchronization.

The upstream to downstream path time measurement is obtained on the basis of the determination of a moment of occurrence T1 of a predetermined lobe of the received measurement ultrasound signal Sr1.

The moment of occurrence T1 is here the instant at which a falling edge of the predetermined lobe occurs. The moment of occurrence T1 is an instant of zero crossing which is measured by a scheme of the "Zero Crossing" type.

The predetermined lobe is a $j^{th}$ lobe of the received measurement ultrasound signal Sr1 after an amplitude of the received measurement ultrasound signal Sr1 has exceeded, at the time T2, a predetermined amplitude threshold Sa. In this instance, here the $j^{th}$ lobe is the fourth lobe 25.

FIG. 4 moreover represents a received measurement ultrasound signal Sr2 which is received by the measurement module 13 after having traversed the path of defined length L from downstream to upstream.

The downstream to upstream path time measurement is obtained on the basis of the determination of a moment of occurrence T'1 of the fourth lobe 26 of the received measurement ultrasound signal Sr2.

The speed of the water is thereafter evaluated by the measurement module 13 as a function of the upstream to downstream path time measurement and of the downstream to upstream path time measurement.

The speed of the water is proportional to a difference between the downstream to upstream path time measurement and the upstream to downstream path time measurement.

It is noted that the water speed measured is an average speed of the water within the diameter of the duct, the speed of the water masses indeed being different at the centre of the duct and in proximity to the walls of the duct.

One of the aims of the measurement method is to obtain a very accurate measurement of the moments of occurrence T1 and T'1.

Each received measurement ultrasound signal Sr is acquired by the slave microcontroller 16 of the measurement module 13.

The analogue-digital converter 21 of the slave microcontroller 16 digitizes a measurement portion of the received measurement ultrasound signal Sr.

The measurement portion corresponds to the fourth lobe defined above. The measurement module 13 commands the moment of emission of the measurement ultrasound signal Se and can therefore estimate a time interval in the course of which the fourth lobe is acquired.

The analogue-digital converter 21 samples at 4 MHz the received measurement ultrasound signal Sr.

Here the slave microcontroller 16 produces four measurement samples each spaced apart by the sampling period $T_e$=250 ns. The four measurement samples are therefore situated on the fourth lobe.

Next, the slave microcontroller 16 estimates an offset of the four measurement samples by calculating an average of the four measurement samples. The offset is subtracted from each measurement sample. As a variant, the offset can be determined on the arithmetic average of all the samples on the previous measurement.

The slave microcontroller 16 then estimates an amplitude of the measurement portion, that is to say of the fourth lobe, on the basis of the measurement samples.

Each measurement sample $A_k$ (k varies here between 1 and 4) can be estimated through the formula:

$$A_k = a_{mes} \cdot \sin(2\pi \cdot fus \cdot n \cdot T_e + \varphi) = a_{mes} \cdot \sin(n \cdot \pi/2 + \varphi),$$ where the phase $\varphi$ is fixed for the measurement samples $A_k$.

The estimation of the amplitude of the fourth lobe therefore consists in calculating the value $a_{mes}$.

The slave microcontroller 16 will thereafter access reference samples contained in a prefilled reference table stored in the memory 18. The reference samples form a reference curve.

Figure 5:
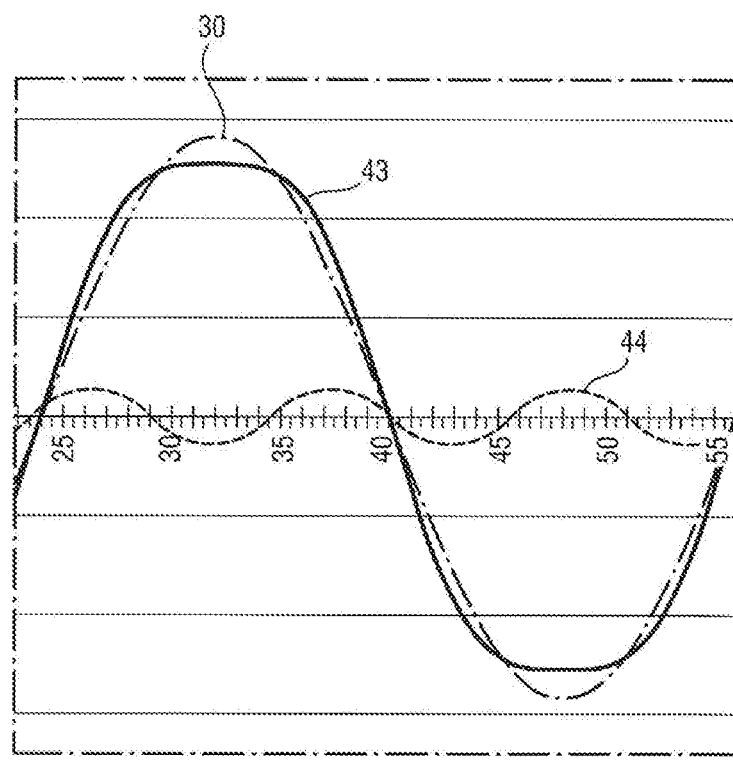
FIG. 5 represents reference curves.

With reference to FIG. 5, here the reference curve is a period of a reference sinusoid 30 of frequency 1 MHz, this corresponding to the frequency fus of the measurement ultrasound signal Se and therefore of the received measurement ultrasound signal Sr. Here, two reference samples are spaced 50 ps apart temporally, so that 20000 reference samples are stored in the memory 18.

The slave microcontroller 16 calculates a ratio between the amplitude of the reference sinusoid 30 and the amplitude of the fourth lobe, and adjusts the measurement samples $A_k$ by multiplying them by the said ratio.

The slave microcontroller 16 therefore produces adjusted measurement samples.

The reference sinusoid 30 constitutes a sinusoidal interpolation of the adjusted measurement samples and therefore of the measurement samples, except for the fact that a unit time shift exists between each adjusted measurement sample and the reference sinusoid 30. In the case where the reference sinusoid 30 has a zero phase, the unit time shift corresponds to the phase of each adjusted measurement sample, that is to say to the phase $\varphi$ mentioned earlier.

The unit time shift is different according to the adjusted measurement samples and depends notably on a jitter in the regulating of the sampling.

For each adjusted measurement sample, the unit time shift is estimated in the following manner.

The value of the adjusted measurement sample is necessarily situated between the values of two reference samples. The slave microcontroller 16 therefore carries out a linear interpolation or a quadratic interpolation of any order n, to obtain, on the reference sinusoid, a reference time with which the value of the adjusted measurement sample is associated. The unit time shift corresponds to the difference between the reference time and the measurement time at which the measurement sample from which the adjusted measurement sample results was acquired.

Next, for each adjusted measurement sample, an instant of zero crossing of the fourth lobe is estimated. This estimation uses the unit time shift and the reference samples of the reference sinusoid 30. The unit time shift makes it possible to fit the reference sinusoid 30 to the adjusted measurement sample. The slave microcontroller 16 therefore uses the reference samples shifted by a delay equal to the unit time shift to determine the instant of zero crossing. The determination of the instant of zero crossing therefore uses "ideal" reference samples that have not undergone any disturbances of jitter type.

Four estimations are therefore obtained here of the instant of zero crossing of the fourth lobe (one estimation for each adjusted measurement sample).

A final estimation of the instant of zero crossing is obtained by averaging the four instants of zero crossing.

The measurement module 13 thereafter calculates an average of the unit time shifts to obtain an overall time shift, corresponding to a shift between the measurement portion and the reference sinusoid 30.

The measurement method thereafter consists in shifting, for the following acquisitions, the sampling of the measurement portion of the received measurement ultrasound signal Sr by a sampling delay equal to the overall time shift. Thus, for the acquisitions which follow, the adjusted measurement samples will coincide with "ideal" reference samples of the reference sinusoid 30.

The shifting of the sampling consists in shifting the clock signal CLK which regulates the analogue-digital converter 21 of the slave microcontroller 16.

A control block 32 and a delay generation block 33 are programmed to this effect in the FPGA 17. The delay generation block 33 comprises a chain 35 of N delay stages and a multiplexer 36.

Each delay stage comprises two inverters arranged in series. The N delay stages are each designated by their position from left to right in the chain. The output of each $k^{th}$ delay stage is linked to the input of the k+1$^{th}$ delay stage.

The FPGA 17 receives the clock signal CLK. The clock signal CLK is applied as input to the first delay stage, that is to say as input to the chain 35 of the N delay stages.

The multiplexer 36 comprises N inputs E1 . . . EN each linked to the output of one of the delay stages, and an output S. The multiplexer 36 moreover receives N control signals 38. Each control signal 38 is associated with a delay stage. All the control signals are at 1, except one of the control signals 38 which is at 0. The output of the delay stage associated with the control signal 38 which is at 0 is applied to the output S of the multiplexer 36. The output S of the multiplexer 36 is linked to the slave microcontroller 16.

The output of each delay stage is associated with a different determined delay applied to the clock signal CLK. The determined delays have been calibrated in the factory and are stored by the master microcontroller 15.

The slave microcontroller 16 therefore acquires the measurement portion of the ultrasound signal received Sr, which portion is digitized by the analogue-digital converter 21.

The slave microcontroller 16 defines the overall time shift and transmits the value of the overall time shift to the master microcontroller 15 via the communication channel 22.

The master microcontroller 15 then applies to the clock signal CLK a sampling delay equal to the overall time shift by programming the control block 32 which produces the control signals 38. The control signals 38 drive the multiplexer 36 so that the delay stage output applied to the output S of the multiplexer 36 is associated with a determined delay equal to the overall time shift.

The master microcontroller 15 then reinitializes the slave microcontroller 16, by virtue of a signal RESET. The slave microcontroller 16 then uses, for the following sampling, a shifted clock signal CLK'. The shifted clock signal CLK' corresponds to the clock signal CLK delayed by a sampling delay equal to the overall time shift.

The slave microcontroller 16 then determines directly, for each adjusted measurement sample, an instant of zero crossing on the basis of the reference samples. A final estimation of the instant of zero crossing is obtained by averaging the four instants of zero crossing.

A shift opposite to the overall time shift is thereafter added to the final estimation of the instant of zero crossing to compensate for the sampling delay.

The path time is thereafter estimated on the basis of the instant of zero crossing.

Figure 6:
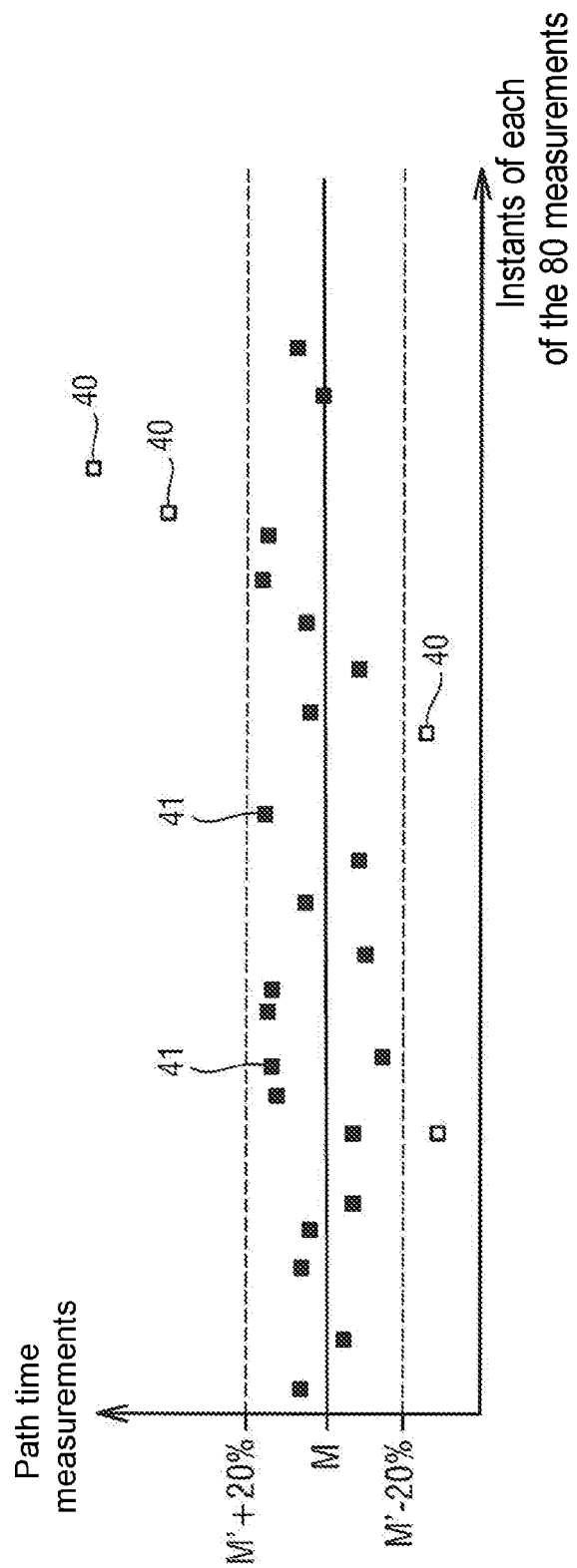
FIG. 6 is a plot on which path time measurement points are represented.

Next, with reference to FIG. 6, the slave microcontroller 16 further improves the accuracy of the path time measurements. The improving of the accuracy of the path time measurements consists firstly in calculating an average M' of a number n of path time measurements. Here the number n is equal to 80.

Inaccurate path time measurements 40 situated outside a span [M'−X; M'+X] are thereafter determined. X is a predetermined percentage of the average M'. X is advantageously between 3% and 30% of M'. Here X is equal to 20% of M'.

The inaccurate path time measurements 40 are thereafter eliminated and M is calculated, which is the average of the path time measurements 41 inside the span [M'−20%; M'+20%].

The accuracy of the path time measurement is thus again significantly improved. The final accuracy obtained is conventionally between 10 ps and 20 ps.

Of course, the operations which have just been described are carried out for the path from downstream to upstream and from upstream to downstream.

The speed of the fluid is then obtained on the basis of the difference between the upstream to downstream path time and the downstream to upstream path time.

The use of the reference sinusoid 30 and of the reference samples makes it possible to circumvent possible path time distortions which would falsify the measurements. Metrological performance is thus improved.

It is noted furthermore that the reference curve does not necessarily comprise a sinusoid period: a quarter period would be sufficient.

The reference curve may moreover exhibit a shape other than sinusoidal. Again with reference to FIG. 5, the memory 18 may for example contain reference samples of pseudo-sinusoidal curves such as the pseudo-sinusoidal curve 43. Each pseudo-sinusoidal curve 43 is sampled at 50 ps.

Each pseudo-sinusoidal curve 43 is obtained by adding one or more additional curves 44 to the sinusoid 30. An additional curve 44 is in this instance a curve of the harmonic of rank 3 of the frequency 1 MHz (that is to say of the frequency of the measurement ultrasound signal).

The choice of the reference curve can then depend on the temperature of the fluid. The master microcontroller 15 acquires, via the temperature measurement block 20, the temperature of the fluid. The master microcontroller 15 then selects from the memory 18 the reference curve whose profile corresponds to the profile of the measurement portion of the measurement ultrasound signal received at the said temperature of the fluid.

It is noted here that, to improve the accuracy of the measurement method, it is possible to carry out all of the operations described not only on the fourth lobe but also on one or more other lobes. A sampling of the fifth lobe and of the sixth lobe is thus carried out for example, the instants of zero crossing of the fifth lobe and of the sixth lobe are determined, and the path time measurements are refined by virtue of the various instants of zero crossing.

The method for measuring a speed of a fluid according to a second embodiment uses a single microcontroller this time. The measurement method is then purely digital, and does not consist in applying a sampling delay to the clock signal of the analogue-digital converter.

In the second embodiment, at each acquisition of a received measurement ultrasound signal, the microcontroller of the measurement module again evaluates a unit time shift between each adjusted measurement sample and the reference curve. The evaluation of the unit time shift is done by linear interpolation or by order n quadratic interpolation.

For each adjusted measurement sample, the microcontroller then "fits" the reference curve to the adjusted measurement sample, estimates the instant of zero crossing, and shifts the instant of zero crossing by the unit time shift. A final estimation of the instant of zero crossing is obtained by averaging the four instants of zero crossing. The speed of the fluid is generated on the basis of the final estimation of the instant of zero crossing, and these operations are reproduced for each received measurement ultrasound signal.

The measurement method according to the second embodiment requires fewer hardware components than the measurement method according to the first embodiment. However, the measurement method according to the second embodiment requires that linear or order n quadratic interpolations be carried out at each new acquisition of a measurement portion of a received measurement ultrasound signal.

The method for measuring a speed of a fluid according to a third embodiment again uses a single microcontroller. The measurement method is again purely digital.

The measurement method consists in acquiring and in digitizing a first received measurement ultrasound signal, acquired by the measurement module after having traversed the path of defined length from upstream to downstream.

A lobe by lobe sinusoidal interpolation is then carried out, making it possible to oversample the received signal.

The sinusoidal interpolation again uses reference samples contained in a prefilled reference table stored in a memory.

A number p of first measurement samples $a1_i$ (here i varies between 1 and p) is thus obtained. The first measurement samples are spaced 50 ps apart temporally.

The measurement method thereafter consists in acquiring and in digitizing a second received measurement ultrasound signal, acquired by the measurement module after having traversed the path of defined length from downstream to upstream.

A number p of second measurement samples $a2_i$ (here i varies between 1 and p) is thus obtained after sinusoidal interpolation. The second measurement samples are spaced 50 ps apart temporally.

Thereafter, the cross-correlation function $K_m$ is calculated for various positive, negative and zero values of m:

$$K_m = \Sigma_{i=0}^{i=p} a1_i a2_{i+m}.$$

The first samples $a1_i$ are therefore delayed in the case where m>0 (and advanced in the case where m<0), in this formula, by m×50 ps with respect to the second samples $a2_{i+m}$.

When the cross-correlation function Km is a maximum, the first received measurement ultrasound signal, which is delayed by m×50 ps, and the second received measurement ultrasound signal, are in phase.

The value of m which maximizes the cross-correlation function therefore gives a time shift between the first received measurement ultrasound signal and the second received measurement ultrasound signal. The time shift corresponds to the DToF, by virtue of which the average speed of the fluid is estimated.

Of course, the invention is not limited to the embodiments described but encompasses any variant entering the field of the invention as defined by the claims.

Although a certain hardware architecture of the measurement module has been presented, the former could be different. The electrical components of the measurement module can also be different. The analogue-digital converter could for example be a different converter, for example a 16-bit Sigma Delta converter. Likewise, instead of comprising two inverters arranged in series, each delay stage could comprise an asynchronous D flip-flop.

The invention applies of course irrespective of the positioning and the configuration of the first transducer and of the second transducer. The measurement ultrasound signals can be emitted with an orientation of any angle with respect to a longitudinal axis of the duct. The measurement ultrasound signals can be reflected by reflectors, for example by mirrors oriented at 45°.

The invention claimed is:

1. A method for measuring a speed of a fluid, comprising the steps of:
   emitting an emitted measurement ultrasound signal;
   acquiring and digitizing a measurement portion of a received measurement ultrasound signal received after the received measurement ultrasound signal has traversed a path of defined length, to obtain measurement samples;
   estimating, on the basis of the measurement samples, an amplitude of the measurement portion;
   accessing reference samples of a prefilled reference table stored in a memory, the reference samples forming a reference curve which constitutes an interpolation of the measurement samples;
   producing adjusted measurement samples by multiplying the measurement samples by a ratio between an amplitude of the reference curve and the amplitude of the measurement portion;
   determining, for each adjusted measurement sample, a unit time shift between the adjusted measurement sample and the reference curve;
   estimating, for each adjusted measurement sample, an instant of zero crossing of the measurement portion on the basis of the unit time shift and of the reference samples;
   estimating, on the basis of an average of the instants of zero crossing, a measurement of path time of the received measurement ultrasound signal to traverse the path of defined length;
   estimating the speed of the fluid on the basis of the path time measurement.

2. The measurement method according to claim 1, in which the unit time shift is determined by carrying out a linear interpolation or a quadratic interpolation of order n on the basis of the reference samples.

3. The measurement method according to claim 1, further comprising the steps of measuring a temperature of the fluid and of selecting, as a function of the temperature of the fluid, the reference curve from among a plurality of stored reference curves.

4. The measurement method according to claim 1, further comprising a preliminary step consisting in estimating and in subtracting from the measurement samples an offset of the said measurement samples.

5. The measurement method according to claim 1, further comprising the step of applying to a sampling of the measurement portion a sampling delay equal to an average of the unit time shifts.

6. The measurement method according to claim 5, in which the application of the sampling delay consists in delaying a clock signal which regulates an analogue-digital converter which digitizes the measurement portion.

7. The measurement method according to claim 6, comprising the steps, to delay the clock signal, of:
   applying the clock signal at input to a chain formed of a plurality of delay stages, anthe output of each delay stage being associated with a determined delay; and
   selecting the output of the delay stage whose determined delay corresponds to the sampling delay.

8. The measurement method according to claim 7, in which a multiplexer as well as the chain formed of the plurality of delay stages are programmed in an FPGA, the multiplexer being used to carry out the selection of the output of the delay stage.

9. The measurement method according to claim 1, further comprising the steps of:
   carrying out a plurality of path time measurements;
   calculating an average M' of the path time measurements;
   eliminating inaccurate path time measurements situated outside a span [M'−X; M'+X];
   calculating an average M of the path time measurements inside the span [M'−X; M'+X];

estimating the speed of the fluid on the basis of the average M.

10. The measurement method according to claim 1, comprising the steps of:
   emitting a first emitted measurement ultrasound signal and a second emitted measurement ultrasound signal;
   acquiring and digitizing a first measurement portion of a first received measurement ultrasound signal received after the first measurement ultrasound signal has traversed a path of defined length from upstream to downstream, to obtain first measurement samples;
   acquiring and digitizing a second measurement portion of a second received measurement ultrasound signal received after the second measurement ultrasound signal has traversed the path of defined length from downstream to upstream, to obtain second measurement samples;
   maximizing a cross-correlation function between the first measurement samples and the second measurement samples to obtain a path time difference;
   estimating the speed of the fluid on the basis of the path time difference.

11. An ultrasound-based fluid meter comprising
   a first transducer;
   a second transducer; and
   a measurement module comprising:
      a master microcontroller;
      a slave microcontroller; and
      an FPGA in which is programmed a delay generation block,
   wherein the ultrasound-based fluid meter is designed to implement a method for measuring a speed of a fluid, comprising:
      emitting an emitted measurement ultrasound signal;
      acquiring and digitizing a measurement portion of a received measurement ultrasound signal received after the received measurement ultrasound signal has traversed a path of defined length, to obtain measurement samples;
      estimating, on the basis of the measurement samples, an amplitude of the measurement portion;
      accessing reference samples of a prefilled reference table stored in a memory, the reference samples forming a reference curve which constitutes an interpolation of the measurement samples;
      producing adjusted measurement samples by multiplying the measurement samples by a ratio between an amplitude of the reference curve and the amplitude of the measurement portion;
      determining, for each adjusted measurement sample, a unit time shift between the adjusted measurement sample and the reference curve;
      estimating, for each adjusted measurement sample, an instant of zero crossing of the measurement portion on the basis of the unit time shift and of the reference samples;
      estimating, on the basis of an average of the instants of zero crossing, a measurement of path time of the received measurement ultrasound signal to traverse the path of defined length;
      estimating the speed of the fluid on the basis of the path time measurement.

12. The ultrasound-based fluid meter according to claim 11, in which the delay generation block comprises a multiplexer and a chain formed of a plurality of delay stages, the output of each delay stage being associated with a determined delay and being linked to an input of the multiplexer.

13. The ultrasound-based fluid meter according to claim 12, in which the slave microcontroller comprises an analogue-digital converter which digitizes the measurement portion, in which a clock signal is applied as input to the chain, in which the master microcontroller drives the multiplexer, and in which a shifted clock signal is situated at the output of the multiplexer and is used to regulate the analogue-digital converter.

14. A non-transitory computer program comprising instructions for implementing, by a microcontroller of an ultrasound-based fluid meter, the measurement method according to claim 1.

15. A non-transitory storage means storing a computer program comprising instructions for implementing, by a microcontroller of an ultrasound-based fluid meter, the measurement method according to claim 1.

* * * * *